United States Patent [19]
Diodato et al.

[11] Patent Number: 5,519,350
[45] Date of Patent: May 21, 1996

[54] CIRCUITRY FOR DELIVERING A SIGNAL TO DIFFERENT LOAD ELEMENTS LOCATED IN AN ELECTRONIC SYSTEM

[75] Inventors: Philip W. Diodato, Asbury; Harry T. Weston, New Providence, both of N.J.

[73] Assignee: AT&T Corp., Murray Hill, N.J.

[21] Appl. No.: 497,350

[22] Filed: Jun. 30, 1995

[51] Int. Cl.$^6$ .............................. H03K 1/04; H01L 25/00
[52] U.S. Cl. .......................... 327/295; 327/565; 327/306; 333/100; 333/136
[58] Field of Search ..................................... 333/100, 125, 333/127, 128, 136; 327/564, 565, 566, 261, 262, 269, 271, 284, 295, 415, 416, 417, 306, 317, 308

[56] References Cited

U.S. PATENT DOCUMENTS

| | | | |
|---|---|---|---|
| 3,586,871 | 6/1971 | Seidel | 333/100 |
| 4,247,817 | 1/1981 | Heller | 327/63 |
| 5,387,885 | 2/1995 | Chi | 333/100 |

OTHER PUBLICATIONS

H. B. Bakoglu et al., "Optimal Interconnection Circuits for VLSI," *IEEE Transaction On Electron Devices*, vol. ED-32, pp. 903–909 (May 1985).

K. Ochii et al., "A 17ns 64K CMOS RAM with a Schmitt Trigger Sense Amplifier," *85 IEEE International Solid-State Circuits Conference*, pp. 64–65, 306 (Feb. 1985).

*Primary Examiner*—Timothy P. Callahan
*Assistant Examiner*—Toan Tran
*Attorney, Agent, or Firm*—David I. Caplan

[57] ABSTRACT

In an electronic system such as an integrated circuit having a number of destination loads such as logic gates, signal is distributed along typically a zero'th level (e.g., polysilicon) electrical transmission line from an input terminal to the destination loads. The characteristics of the signal arriving at the destination loads are improved by (1) inserting an added electrical transmission line, and (2) connecting various nodes of the added electrical transmission line through auxiliary active devices, such as inverters, to various nodes on the zero'th level electrical transmission line. In one attractive arrangement, each of the auxiliary active devices has an electrical-current-drive capability that increases monotonically with the number of nodes intervening between it and the input terminal of the added electrical transmission line.

22 Claims, 2 Drawing Sheets

CIRCUITRY FOR DELIVERING A SIGNAL TO DIFFERENT LOAD ELEMENTS LOCATED IN AN ELECTRONIC SYSTEM

FIELD OF THE INVENTION

This invention relates to electronic systems and more particularly to circuitry for delivering electronic signals to load elements located in such systems.

BACKGROUND OF THE INVENTION

The speed performance of an electronic system is often limited by the speed at which either information signals or clock signals or both can be propagated to the various load elements in the system. For example, the system can be (or can be part of) an integrated circuit located on a single silicon chip ("substrate"), and the load elements can be, for example, such elements or devices as inverters, NOR gates, OR gates AND gates, NAND gates, transmission gates ("pass transistors"), flip-flop devices, or tri-state buffers. These logic gates thus constitute "destination logic gates" (or "destination load elements") for the information signals or the clock signals or both the information and the clock signals. The various differences in arrival times of a given signal at different destination gates within the system ("propagation time delays") impose a limitation on the speed performance of the system. These differences in arrival times are caused by different propagation time delays ("temporal dispersion") in the transmission of the propagating signal to the destination load elements.

Within a synchronous system whose timing is controlled by a clock signal (i.e., a periodic, rectangular shaped signal), the timing is ordinarily limited by the delays in the arrivals of the edge of this clock signal at the various destination load elements: the longest such delay in the clock signal determines the so-called "latency time" of the system. The delays in other (e.g., "data") signals are not as critical, since the important feature of these other signals is their sufficient magnitude (and not their sharpness) at the moment of time of arrival of the clock edge. Hence the temporal dispersions of these other signals do not constitute a limiting factor on the operation of the system, owing to the more severe limitation imposed by the temporal dispersion of the (hopefully sharp) edges of the clock signal arriving at different destination gates. As used herein, the term "latency time" refers to the longest time delay of the clock signal to any destination gate in the system.

For example, FIG. 1 shows an exemplary prior-art electronic system including an input buffer B formed by two cascaded inverters. This input buffer B is fed by a clock signal source C that serves as a source of the clock signals. The input buffer B has an output node N0, serving as an input terminal for delivery of the clock signals to an electrical transmission line L0. This electrical transmission line L0 is connected to a total of illustratively thirty-two destination load elements G1, G2,...G31, and G32. These destination load elements will be referred to generically as G for brevity and convenience. The destination load elements G thus control the flow of data in a thirty-two-bit data "bus" controlled by the destination load elements, as will be explained in greater detail below. The load elements G are represented pictorially in FIG. 1 by load inverters G solely for purposes of illustration: any of these load elements G can be any other type of clocked logic gate, clocked buffers, clocked flip-flop devices, or clocked transmission gate. At any rate, since all the destination load elements G are controlled by at least the clock signal supplied by the clock source C, these elements G can be referred to more comprehensively as "clock-signal-controlled destination load elements" G.

As indicated in FIG. 2, an exemplary load element such as G1 can take the form of a clock-controlled ("clocked") logic gate, such as a clocked OR gate. In addition to the clock signal propagating from the electrical transmission line L0 to an input terminal i1 of this load element G1, this OR gate has as inputs a pair of input signals D11 and D21. Thus when either of the input signals D11 or D21 is a digital "1" ("high" level signal), the output of the gate G1 at its output terminal g1 is assuredly also a digital "1" as soon as the clock signal (typically a clock edge) arrives at the input terminal i1 of the destination load element G1. Thus the destination load element G1 is clocked-as are all the other destination load elements G-by the arrival of the clock signal (typically the edge thereof) propagating along the electrical transmission line L0 to their respective clock input terminals.

In one approach of prior art, in order to compensate for signal amplitude losses and signal degradations (losses of original signal wave shape) suffered along the electrical transmission line L0 as the clock signal propagates from the input terminal N0 of the electrical transmission line L0 to the destination load elements G, a repeater r (signal amplifier) is inserted as shown (FIG. 1). These losses and degradations are caused by the resistances and capacitances along the electrical transmission line L0, especially by the input capacitances of the destination load elements G. The electrical transmission line L0 can have a number of cascaded repeaters r or instead can have a number of cascaded drivers that increase in current-drive capability going down the line away from the input terminal N0-as described, for example, in a paper by H. B. Bakoglu et al., published in IEEE Transaction On Electron Devices, Vol. ED-32, pp. 903–909 (May, 1985), especially at p. 906, FIG. 5.

The electrical transmission line L0 (FIG. 1) is typically a "zero'th" metallization level polysilicon wire ("line") having unavoidable distributed parasitic capacitance to the silicon substrate and unavoidable distributed resistance along this electrical transmission line. As compared with all other levels of metallization, zero'th level polysilicon lines are located closest to the underlying silicon substrate. Nevertheless, the parasitic capacitance (to substrate ground) per unit length of zero'th level wire is not significantly higher than that of an equally long metallic line located on the first or second or still higher levels of metallization: most of length of the electrical transmission line is located on relatively thick field oxide rather than relatively thin gate oxide. However, the resistance per unit length of zero'th level wire is significantly higher than that of first or higher level metallization, and therefore this resistance contributes to undesirable "RC" time delays along the electrical transmission line L0.

In addition, the input capacitance with which the clock signal is confronted at the input terminal of each of the destination load elements G constitutes another parasitic, and this parasitic contributes further unwanted capacitance faced by the propagating clock signal. For example, in MOS (metal oxide semiconductor) technology, this parasitic input capacitance is the capacitance of the gate electrode of the transistor to which the electrical transmission line L0 is connected.

Because of these parasitic resistances and capacitances, unavoidable "RC" time delays are suffered by clock signal edges propagating from the output node N0 to the various load elements G. The RC time delays depend upon the geometry (topology) of the various paths along the electrical transmission line L0 from the output node N0 of the buffer B to the load elements G. The load elements G that are located in closer proximity to the node N0 receive their clock signal edges from this node N0 earlier than the load elements G that are located more remotely from the node N0. Hence these time delays are different from one another ("temporal dispersion"). The longest such time delay can be relatively very long in case the relevant effective RC for the worst case load element G (i.e., G32) is relatively large. Thus, in a worst case scenario, the system can suffer both from an undesirably long latency time and from an undesirably large signal skew. As used herein, the term "signal skew" refers to the situation in which the propagation time delays for the various loads are different from one another.

Another problem that arises in the system shown in FIG. 1 stems from the fact that a clock signal edge involves a sharp jump, the sharpness of which is undesirably degraded by the time the edge arrives at some of the more remotely located load elements G.

FIG. 3 shows a system illustratively including a 32-bit clocked data bus showing one way in which prior art attempted to mitigate one or more of the foregoing problems: namely, by means of an added electrical transmission line L2 having a lower resistance per unit length than that of the electrical transmission line L0. The added electrical transmission line L2 can be located, for example, either on the zero'th (typically, polysilicon) metallization level or on a second (typically, metallic or metallic-like) metallization level, the second metallization level being separated from a major surface of the substrate by a larger distance than the zero'th. That is to say, neglecting small contributions by gate oxide regions relative to field oxide regions of a zero'th metallization level added electrical transmission line L2 to average distance of separation of this added electrical transmission line L2 from the major surface of the substrate, the average distance of separation d2 of a zero'th metallization level added electrical transmission line L2 from the major surface of the substrate is equal to the average distance of separation d1 of the zero'th metallization level electrical transmission line L0 from the major surface of the substrate. Similarly the average distance of separation d2 of a second metallization level added transmission line L2 from the major surface of the substrate is significantly greater than the average distance of separation d1 of the zero'th metallization level transmission line L0 from the major surface of the substrate. At the same time, the repeater r is omitted, and the electrical-current-drive capability of (e.g., the transistor widths in) the buffer B is increased. The electrical transmission line L2 runs essentially parallel to the electrical transmission line L0.

As further shown in the example illustrated in FIG. 3, an input terminal of illustratively every fourth destination load element (load inverter) G is connected to a proximate node of the added electrical transmission line L2, typically by means of a separate, relatively low resistance connection (electrically "passive strap") denoted by P1, ..., P8.

Because of the straps P1, ..., P8, even without any repeater in the system shown in FIG. 3, propagation time delays are reduced somewhat as compared with the propagation time delays suffered in the system shown in FIG. 1. However, the amount of these delays can still be higher than may be desired owing to the input capacitances of the destination load elements, although signal skew is dramatically reduced as compared to the system shown in FIG. 1. Furthermore, in the system shown in FIG.3, sharp signal edges can still suffer from an undesirable amount of degradation. A passive strapping scheme, similar to that shown in FIG.3, was disclosed in the context of reducing word-line delays in high density RAMs (random access memories) in a paper by Kiyofumi Ochii et al., published in 85 IEEE International Solid-State Circuits Conference, pp. 64–65,306 (February, 1985) at p.64 col. 2.

Therefore it would be desirable to have an electronic system that mitigates one or more of the aforementioned shortcomings of prior art.

SUMMARY OF THE INVENTION

According to the invention, the electronic system shown in FIG. 3 is modified (1) by replacing each of the passive straps P1, ..., P8 with a separate active device (FIG. 4: I1, I2, ... I8), typically an inverter or other kind of amplifying device (ordinarily having an inverter in its output stage) and (2) by breaking the connection between the input side of the electrical transmission line L0 and the output node N0 of the buffer B. In addition, if it is desired to preserve the polarity of the signal propagating to the destination logic elements G, then an inverting element (FIG. 4: IA) is inserted between the output node N0 of the buffer B and the electrical transmission line L2.

In a specific embodiment of the invention, an electronic system, for delivering a common signal such as a clock signal to destination load elements, comprises an integrated circuit including (a) a semiconductor substrate;

(b) a first plurality of the destination load elements integrated in the semiconductor substrate;

(c) a first electrical transmission line located on a zero'th level of metallization overlying a major surface of the semiconductor substrate and separated therefrom by a first average distance d1, the first transmission line having a plurality of nodes, each of the destination load elements having an input node electrically separately connected to a separate one of the nodes of the first transmission line;

(d) a second electrical transmission line having an input terminal for receiving the common signal, the second transmission line located on a second level of metallization overlying the major surface of the semiconductor substrate and separated therefrom by a second average distance d2, with d2>d1;

(e) electrically active devices having output terminals connected to a second plurality of nodes of the first electrical transmission line and input terminals connected to a second plurality of nodes of the second electrical transmission line, the second plurality being less than or equal to the first plurality.

As an alternative to subparagraph (e) above, the electrical-current-drive capability of the active devices can be made mutually equal but in this case the nodes of the second electrical transmission line are not equi-spaced. Instead, the distances between successive nodes decrease monotonically with distance from the input terminal of the first electrical transmission line. As a further alternative, both the distances between successive nodes of the second electrical transmission line and the electrical-current-drive capabilities of the active devices are varied along the second electrical transmission line.

Advantageously, in any event, the nodes of the second electrical transmission line are equi-spaced as measured in terms of the number of nodes of the first electrical transmission line to which the nodes of the second electrical transmission line are connected through the active devices. In other words, the electrically active devices are uniformly (equally) spaced apart (hereinafter "equi-spaced") as measured in terms of the number of destination loads located between successive electrically active devices. Also, advantageously the electrical current-drive-capabilities (e.g., transistor sizes) of the active devices increase monotonically with remoteness from the input terminal of the second electrical transmission line. This remoteness is measured in terms of the number of nodes of the second electrical transmission line that are located between the active device under consideration and the input terminal.

Optionally, the second electrical transmission line is located on second level metallization and thus is located at a greater distance from the major surface of the substrate than is the zero'th level (that is, d2>d1). In this way, both the capacitance and the resistance per unit length are reduced.

Ordinarily, as known in the art, a first level line of metallization runs mainly perpendicular to and between the zero'th level electrical transmission line L0 and the second level electrical transmission line L2.

Elements in different FIGURES that are similar are denoted by the same labels.

DETAILED DESCRIPTION

Figure 1:
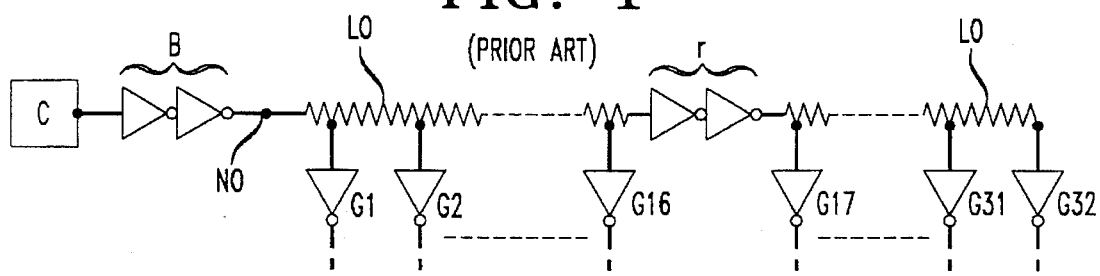
FIG. 1 is a schematic diagram of an electronic system including circuitry for distributing a clock signal to destination load elements according to a specific embodiment of prior art.
Figure 2:
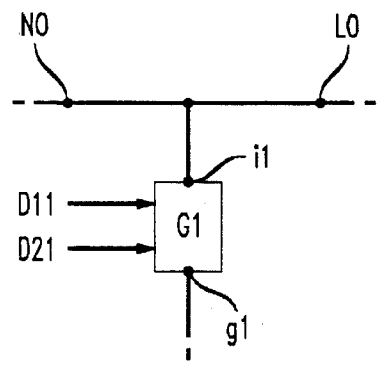
FIG. 2 is a circuit schematic of an exemplary destination load element according to a specific embodiment of prior art.
Figure 3:
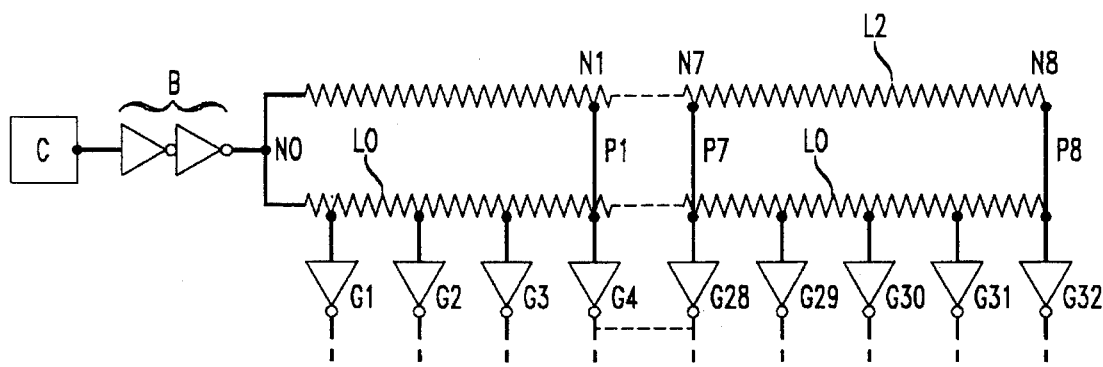
FIG. 3 is a schematic diagram of an electronic system including other circuitry for distributing a clock signal to destination load elements according to another specific embodiment of prior art.
Figure 4:
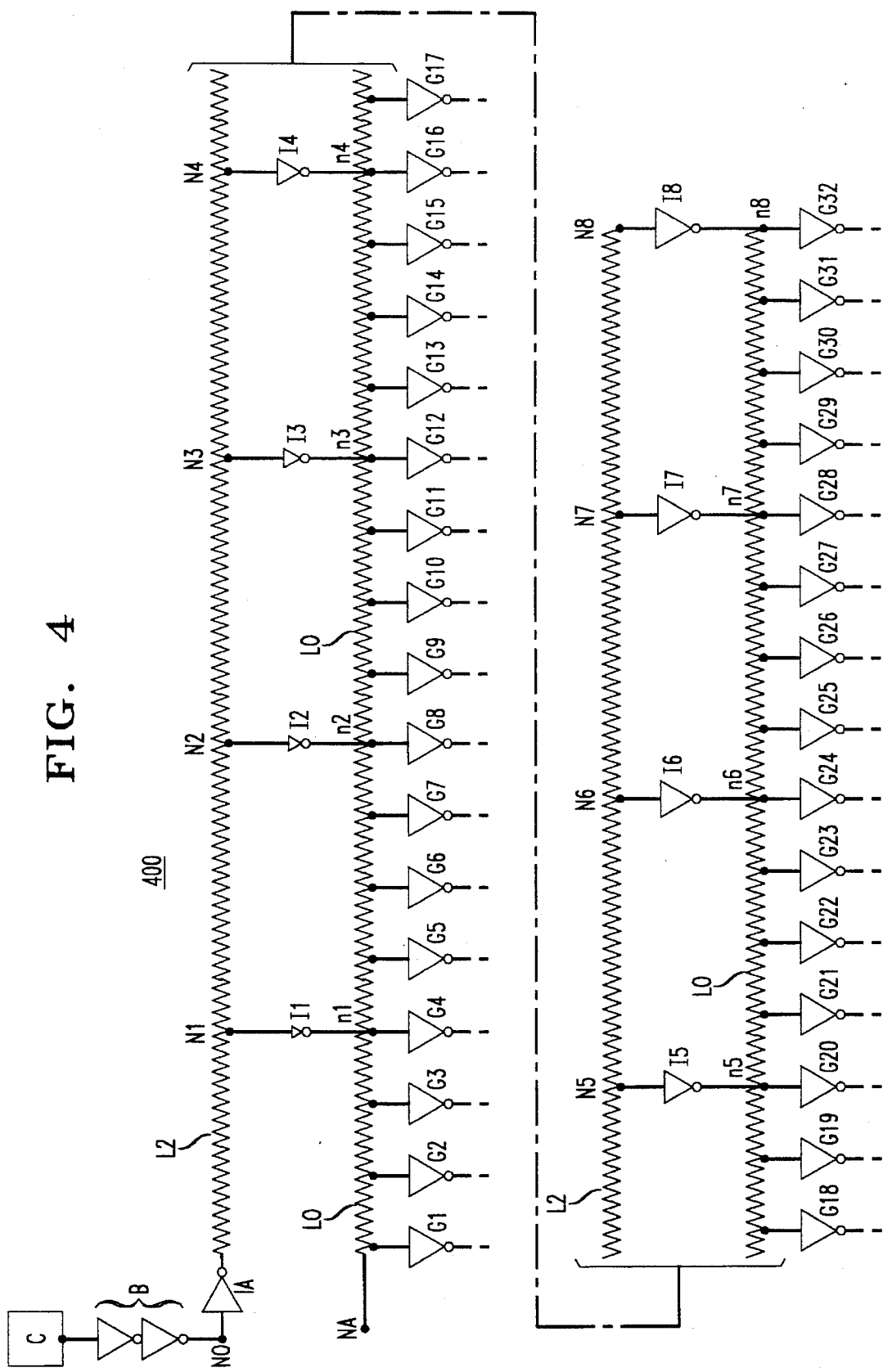
FIG. 4 is a schematic diagram of an electronic system including yet other circuitry for distributing signals, according to a specific embodiment of the invention.

As shown in FIG. 4, an electronic system 400 is part of circuitry (not shown) that is integrated at a major surface of a monocrystalline semiconductive silicon or other kind of substrate (not shown). The system 400 includes a plurality of destination load elements, typically logic gates. These logic gates are represented in FIG. 4 by a plurality of destination inverters G. The electrical transmission line L0 is located on the zero'th level metallization, and the electrical transmission line L2 is located on the zero'th level metallization and preferably on the second level metallization, as described above in connection with FIG. 3. The entire circuitry shown in FIG. 4 can be built in CMOS, NMOS, bipolar technology, or other technology, or any combination thereof.

The electrical transmission line L0 in the system 400 has a left-hand extremity, denoted by node NA. This node NA is not connected to the node N0 as it was in the system shown in FIG. 3.

As further shown in FIG. 4, the input terminal of every fourth destination load inverter G is separately connected to a proximate node n1, n2, n3, ..., n7, n8 of the electrical transmission line L0. Each of the nodes N1, N2, N3, ..., N7, N8 of the electrical transmission line L2 is connected to the respective proximate node n1, n2, n3, ..., n7, n8 of the electrical transmission line L0 via an auxiliary inverting element I1, I2, I3, , ..., I7, I8, respectively. Thus, each such proximate node n1, n2, n3, ..., n7, n8 of the electrical transmission line L0 is connected to a proximate node N1, N2, N3, ..., N7, N8 of the electrical transmission line L2 via a separate auxiliary inverting element I1, I2, I3, ..., I7, I8, respectively. More specifically, in the specific embodiment shown in FIG. 4, an input terminal of every fourth destination load element G is separately connected to an output terminal of the auxiliary inverting elements I1, I2, I3, ... ,I7, I8, respectively. At the same time, an input terminal of each of the auxiliary inverting elements I1, I2, I3,..., I7, I8 is separately connected to the respective proximate node N1, N2, N3, ..., N7, N8, respectively, of the electrical transmission line L2.

An inverter IA is inserted, as shown in FIG. 4, at the input end of the electrical transmission line L2 if it is desired to preserve the polarity of signals delivered by the buffer B to the destination logic gates G. If not, then the inverter IA is omitted. In such a case, the input side of the transmission line L2 can be directly connected to the output node N0 of the buffer B. Alternatively, the polarity can be preserved by omitting IA and at the same time omitting one of the two inverters in the buffer B.

As an option, any active element such as a non-inverting buffer can be used for any of the auxiliary inverting elements I1, I2, ..., I7, or I8. Also, the buffer B could be inverting by omitting one of its inverters.

To obtain even better clock-signal-distribution performance, the resistance (and capacitance) per unit length of the electrical transmission line L2 can be reduced to a value(s) smaller than that (those) of the electrical transmission line L0. This reduction(s) can be achieved by locating the electrical transmission line L2 on the second level of metallization (where resistance per unit length can be made lower). The second level metallization can then be made of a standard second level metal or alloy as is commonly used for second level metallization as known in the art.

In the system 400, it is assumed that the input capacitance of each of the destination load elements G is the same for all, which is ordinarily (at least approximately) the situation that occurs in many, if not most, practical applications. As indicated by the relative sizes of the auxiliary inverting elements I1, I2,..., I7, I8, in such cases of equal input capacitances of the destination load elements G, the electrical-current-drive capability of each of these auxiliary inverting elements monotonically increases with distance from the input terminal N0 of the electrical transmission line L2, this distance being measured in terms of the number of nodes, located on the electrical transmission line L2, intervening between the auxiliary inverting element under consideration and the input terminal N0. More specifically, an auxiliary inverting element (or other auxiliary active element) whose output stage is composed of a p-channel MOS transistor connected in series with an n-channel MOS transistor, has an electrical-current-drive capability that is directly proportional to the width-to-length (W/L) ratio of the channels.

Illustratively, by way of an example, the input capacitances of all the load elements G being equal to X, the values of the electrical-current-drive capabilities of auxiliary inverters I1, I2, I3, I4, I5, I6, I7, and I8 are made respectively equal to X/3, X/3, 2X/3, 2X/3, 2X/3, 2X/3, X, and X. A useful method of obtaining the relative values of the electrical-current-driving capabilities of the auxiliary inverters I1, I2, I3, I4, I5, I6, I7, and I8 is by first assuming that their electrical-current-drive capabilities are all equal to X, and then applying circuit simulation to determine the delays of the propagating clock signal to the various destination load elements G by means of circuit simulation as determined by the Elmore delay model (W.C. Elmore, "The Transient Response of Damped Linear Networks with Particular Regard to Wideband Amplifiers," Journal Applied Physics, Vol. 19, pp. 55–63, January, 1948) or other circuit simulation models such as described in the book entitled *Computer-Aided Circuit Analysis Using Spice*, authored by Walter Banzhaf (Prentice Hall, Englewood Cliffs, NJ 07632, 1989). Although the invention has been described in detail in terms of a specific embodiment, various modifications can be made without departing from the scope of the invention. For example, the destination inverters G can be various kinds of logic gates other than inverters, or can be flip-flop devices, tri-state buffers, or other gates having an input terminal that has input capacitance. The node N0 can be connected to other clock signal transmission lines, similar to the transmission line L2, in combination with the electrical transmission line L0. Also, the node N0 can be connected to other forms of electrical transmission lines or wiring, whereby the clock signal from the clock source C can be delivered to other load elements located in another clocked data bus, for example.

Instead of the clock signal source C delivering its clock signals to only a single buffer B, it can deliver them to many such buffers, each of such buffers delivering the clock signal to a separate 32-bit clocked data bus.

Instead of a total of eight equi-spaced nodes N1-N8 along the electrical line L2 in combination with eight equi-spaced nodes n1–n8 along the electrical transmission line L0, a total of sixteen equi-spaced nodes along each of the electrical transmission lines L2 and L0 is an attractive option. That is to say, instead of four bits per node-two bits per node is an attractive option.

Moreover, instead of equi-spaced nodes, unequally spaced nodes can be used in combination with making the distance between nodes monotonically smaller with increasing distance from the node N0 and making the sizes (electrical-current-drive capabilities) of the auxiliary inverters mutually equal. Alternatively, both the distances between nodes and the sizes of the auxiliary inverters I1, ..., In can be varied, where In is the auxiliary inverter located most remote from the input terminal N0. Instead of a 32-bit clocked data bus, any clocked bus having other than 32 bits can take advantage of the invention's use of auxiliary active devices. Furthermore, instead of a clocked bus, the invention is applicable to the delivery of any kind of common electrical signal via an electrical transmission line to a number of common-signal-controlled destination load elements connected to the electrical transmission line at various respective locations thereof.

What is claimed is:

1. An electronic system, for delivering a common signal to destination load elements, comprising:

(a) a first plurality of the destination load elements;

(b) a first electrical transmission line having a plurality of nodes, each of the destination load elements having an input node electrically separately connected to a separate one of the nodes of the first electrical transmission line;

(c) a second electrical transmission line having an input terminal for receiving the common signal;

(d) electrically active devices each of which has an input node separately connected to a separate node of a second plurality of successive nodes of the second electrical transmission line, and each of which has an output node separately connected to a separate node of a second plurality of successive nodes of the first electrical transmission line, the second plurality being less than the first plurality.

2. The system of claim 1 in which the first electrical transmission line comprises a polysilicon line located on a zero'th level of metallization overlying a major surface of a semiconductor substrate and separated therefrom by a first average distance d1, and in which the second electrical transmission line is located on a second level of metallization overlying the major surface of the substrate and separated from major surface of the substrate by a second average distance d2, with d2>d1.

3. The system of claim 2 in which the second electrical transmission line comprises a second polysilicon line and in which d2 is approximately equal to d1.

4. The system of claim 3 in which at least some of the electrically active devices comprise inverting elements.

5. The system of claim 4 which further comprises a source of the common signal, the source having an output node connected to the input terminal of the second electrical transmission line, the electrically active devices having electrical-current-drive capabilities that increase monotonically with the number of the successive nodes of the second electrical transmission line intervening between the active devices and the input terminal of the second electrical transmission line.

6. The system of claim 5 in which the source is a clock signal source.

7. The system of claim 1 in which at least some of the electrically active devices comprise inverting elements.

8. The system of claim 1 which further comprises a source of the common signal having an output node connected to the input terminal of the second electrical transmission line, the electrically active devices having electrical- current-drive capabilities that increase monotonically with the number of the successive nodes of the second electrical transmission line intervening between the active devices and the input terminal of the second electrical transmission line.

9. The system of claim 8 in which the source is a clock signal source.

10. The system of claim 1 in which the first electrical transmission line comprises a polysilicon line located on a zero'th level of metallization overlying a major surface of a semiconductor substrate and separated therefrom by a first average distance d1, and in which the second electrical transmission line is a metal or alloy line, the second electrical transmission line being located on a second level of metallization overlying the major surface of the substrate, and the second electrical transmission line being separated from major surface of the substrate by a second average distance d2, with d2>d1.

11. The system of claim 1 in which the number of destination load elements connected between successive nodes of the second electrical transmission line are equal.

12. The system of claim 11 in which the number of destination load elements connected between successive nodes are equal to four.

13. The system of claim 11 in which the number of destination load elements connected between successive nodes are equal to two.

14. The system of claim 11 in which the first electrical transmission line comprises a polysilicon line located on a zero'th level of metallization overlying a major surface of a semiconductor substrate and separated therefrom by a first average distance d1, and in which the second electrical transmission line is located on a second level of metallization overlying the major surface of the substrate and separated from major surface of the substrate by a second average distance d2, with d2>d1.

15. The system of claim 14 in which the second electrical transmission line comprises a second polysilicon line and in which d2 is approximately equal to d1.

16. The system of claim 15 which further comprises a source of the common signal, the source having an output node connected to the input terminal of the second electrical transmission line, the electrically active devices having electrical current-drive-capabilities that increase monotonically with the number of the successive nodes of the second electrical transmission line intervening between the active devices and the input terminal of the second electrical transmission line.

17. The system of claim 1 in which the distances between successive nodes of the second plurality decrease monotonically with the number of the successive nodes of the second electrical transmission line intervening between the active devices and the input terminal of the second electrical transmission line.

18. The system of claim 17 in which the first electrical transmission line comprises a polysilicon line located on a zero'th level of metallization overlying a major surface of a semiconductor substrate and separated therefrom by a first average distance d1, and in which the second electrical transmission line is located on a second level of metallization overlying the major surface of the substrate and separated from major surface of the substrate by a second average distance d2, with d2>d1.

19. The system of claim 18 in which the second electrical transmission line comprises a second polysilicon line and in which d2 is approximately equal to d1.

20. The system of claim 19 in which at least some of the electrically active devices comprise inverting elements.

21. The system of claim 1 further comprising a source of the common signal, the source having an output node connected to the input terminal of the second electrical transmission line.

22. The system of claim 21 in which the source is a clock signal source.

* * * * *